US009368174B2

(12) United States Patent
Nishio

(10) Patent No.: US 9,368,174 B2
(45) Date of Patent: Jun. 14, 2016

(54) DATA STROBE CONTROL DEVICE

(71) Applicant: PS4 Luxco S.a.r.l., Luxembourg (LU)

(72) Inventor: Yoji Nishio, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 413 days.

(21) Appl. No.: 13/868,463

(22) Filed: Apr. 23, 2013

(65) Prior Publication Data

US 2013/0294176 A1  Nov. 7, 2013

(30) Foreign Application Priority Data

May 1, 2012 (JP) ................................ 2012-104613

(51) Int. Cl.
| G11C 7/10 | (2006.01) |
| G11C 8/18 | (2006.01) |
| G11C 7/22 | (2006.01) |
| G11C 11/4076 | (2006.01) |
| G11C 11/4093 | (2006.01) |
| G11C 29/02 | (2006.01) |

(52) U.S. Cl.
CPC .. *G11C 8/18* (2013.01); *G11C 7/10* (2013.01); *G11C 7/1087* (2013.01); *G11C 7/1093* (2013.01); *G11C 7/222* (2013.01); *G11C 11/4076* (2013.01); *G11C 11/4093* (2013.01); *G11C 29/022* (2013.01); *G11C 29/023* (2013.01); *G11C 29/028* (2013.01)

(58) Field of Classification Search
CPC ...... G11C 7/10; G11C 7/1087; G11C 7/1093; G11C 11/4076; G11C 11/4093; G11C 7/222
See application file for complete search history.

(56) References Cited

U.S. PATENT DOCUMENTS

| 7,038,953 | B2 | 5/2006 | Aoki | |
| 2006/0087894 | A1* | 4/2006 | Kim | G11C 7/1066 365/189.02 |
| 2009/0019184 | A1* | 1/2009 | Skerlj | G06F 13/1684 710/5 |
| 2010/0315891 | A1* | 12/2010 | Welker | G06F 13/1689 365/193 |
| 2011/0205832 | A1 | 8/2011 | Jeon | |
| 2012/0063246 | A1* | 3/2012 | Suzuki | G11C 7/1066 365/193 |

FOREIGN PATENT DOCUMENTS

| JP | 2005-276396 A | 10/2005 |
| JP | 2011-176816 A | 9/2011 |

* cited by examiner

*Primary Examiner* — Douglas King

(57) ABSTRACT

A control device that comprises a first data strobe input terminal to be connected in common to data strobe terminals that are included respectively in first memory devices, and a plurality of first sub-units each coupled to the first data strobe input terminal and each holding a data strobe delay value corresponding to an associated one of the first memory devices, and the data strobe delay values of the sub-units being independent from each other.

14 Claims, 13 Drawing Sheets

DATA STROBE CONTROL DEVICE

REFERENCE TO RELATED APPLICATION

The present application is based upon and claims the benefit of the priority of Japanese Patent Application No. 2012-104613, filed on May 1, 2012, the disclosure of which is incorporated herein in its entirety by reference thereto.

TECHNICAL FIELD

The present invention relates to a control device, a memory system and a memory module. As an example, the invention relates to a control device in a memory system including a memory module on which multi-rank memory devices are loaded, with the control device training a data strobe signal. The invention also relates to the memory system provided with the control device, and to the memory module.

BACKGROUND

Patent Literature 1 shows a memory interface control circuit in which a data strobe signal provided from a DDR2-SDRAM (Double Data Rate 2 Synchronous Dynamic Random Access Memory) is delayed by a variable delay circuit to adjust the timing to latch data provided from the DDR2-SDRAM.

Patent Literature 2 shows training an asynchronous ODT (On-Die Termination, termination resistance). It also shows a memory module including a plurality of memory ranks.

The entire disclosures of the above mentioned Patent Literatures are incorporated herein by reference thereto. The following analysis is given by the present invention.

In a memory system including a memory module, having a plurality of memory ranks, and a control device, such as a memory controller, the control device determines a shift value of a data strobe signal for a plurality of memory devices belonging to the same rank group, that is, a plurality of memory devices whose data terminals as well as data strobe terminals are connected in common. In determining the shift value of the data strobe signal, training is carried out for just one of the plurality of memory devices of the same rank group.

However, in such method, the delay value in forwarding between the control device and a plurality of memory devices in the rank group cannot be represented accurately. Therefore, there is a risk that the margin in receiving data by the control device tends to be decreased.

Patent Literature 1 shows that, in case a plurality of DDR2-SDRAMs are arranged relative to an LSI (Large Scale Integration) having a memory interface loaded thereon, more specifically, in case the DDR2-SDRAMs are arranged at a distal end and at a proximal end of the LSI, the delay value of a data strobe signal (DQS) is to be adjusted separately. However, it is not shown that, in case a plurality of DDR2-SDRAMs are arranged at the proximal end or at the distal end of the LSI, training of the data strobe signal DSQ is to be carried out for each of the DDR2-SDRAMs.

Patent Literature 2 shows a memory module including a plurality memory ranks. However, it is completely silent about training the data strobe signal. On the other hand, Patent Literature 2 shows training the ODT signal. However, the ODT signal is supplied in common to the plurality of memory ranks, while it is not shown that training of the ODT signal is to be carried out separately for respective memories of the same rank group.

Patent Literature 1

JP Patent Kokai Publication No. JP2005-276396A

Patent Literature 2

JP Patent Kokai Publication No. JP2011-176816A

SUMMARY

In one embodiment, there is provided a control device that comprises a first data strobe input terminal to be connected in common to data strobe terminals that are included respectively in first memory devices, and a plurality of first sub-units each coupled to the first data strobe input terminal and each holding a data strobe delay value corresponding to an associated one of the first memory devices, and the data strobe delay values of the sub-units being independent from each other.

With the control device according to the present invention, it is possible to improve a receiving margin in receiving, by the control device, data supplied from each of the memories of a same rank group.

BRIEF DESCRIPTION OF THE DRAWINGS

The above features and advantages of the present invention will be more apparent from the following description of certain preferred embodiments taken in conjunction with the accompanying drawings, in which.

PREFERRED MODES

Figure 1A:
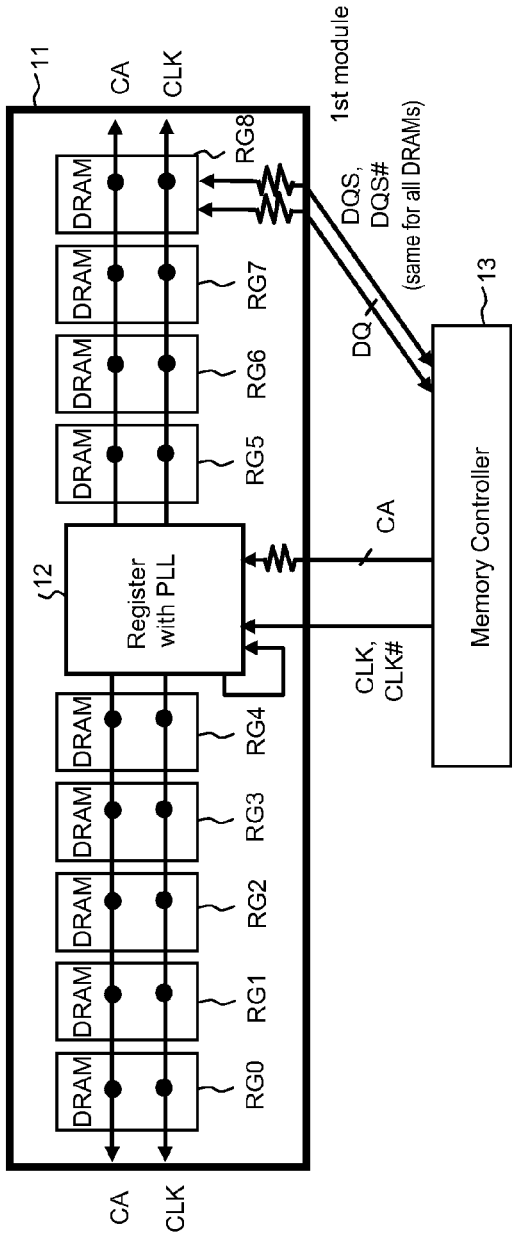
FIGS. 1A and 1B are diagrammatic views showing schematics of an example configuration of a memory system.

The invention will be now described herein with reference to illustrative embodiments. Those skilled in the art will recognize that many alternative embodiments can be accomplished using the teachings of the present invention and that the invention is not limited to the embodiments illustrated for explanatory purposes. Initially, schematics according to an exemplary embodiment will be explained. It is noted that reference symbols used in the schematics in referring to the drawings are only for assisting in the understanding and are not intended to limit the scope of the invention to the mode shown.

Figure 4:
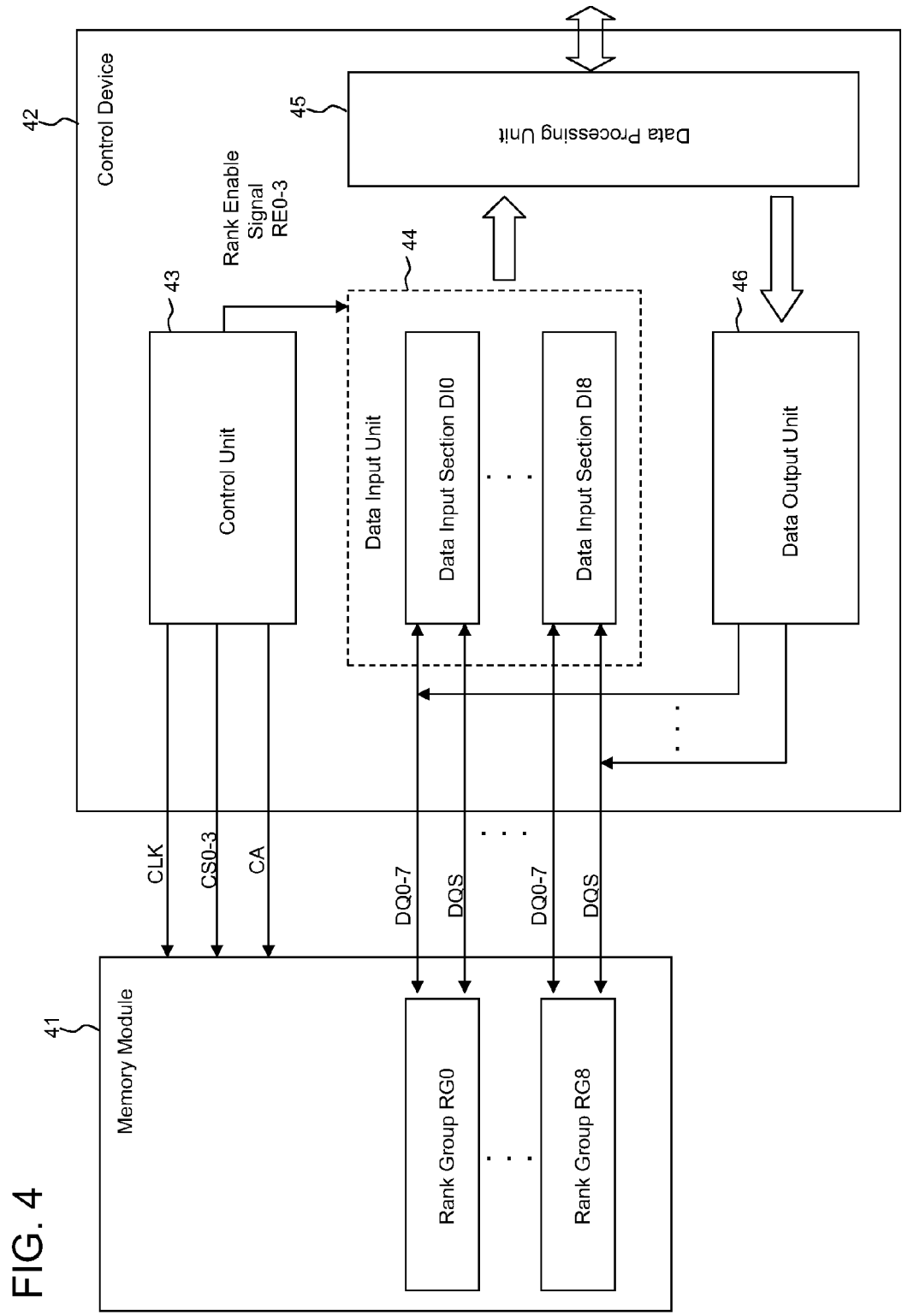
FIG. 4 is a block diagram showing an example configuration of a control device in the memory system according to the first exemplary embodiment.

FIG. 4 depicts a block diagram showing an example configuration of a memory system. With reference to FIG. 4, the memory system includes a memory module (41) and a control device (42).

The control device (42) includes a data strobe input terminal connected in common to data strobe terminals (DQS) of a plurality of memory devices belonging to a same rank group. It is noted that these data strobe terminals (DQS) and data terminals of the memory devices of the same rank group are connected in common. The control device (42) holds a plurality of respectively independent data strobe delay values corresponding to each of the plurality of memory devices. When fed with data from one of the plurality of memory devices, the control device (42) delays a data strobe signal, supplied from one of the plurality of memory devices, depending on a data strobe delay value corresponding to the one memory device, such as to adjust a timing of latching the data supplied from the one memory device.

In the above described memory system, the phase of the data strobe signal may be adjusted independently for respective memory devices belonging to the same rank group. It is thus possible to improve a receiving margin in receiving, by the control device, data supplied from respective ones of the memories of a same rank group.

First Exemplary Embodiment

Figure 1B:
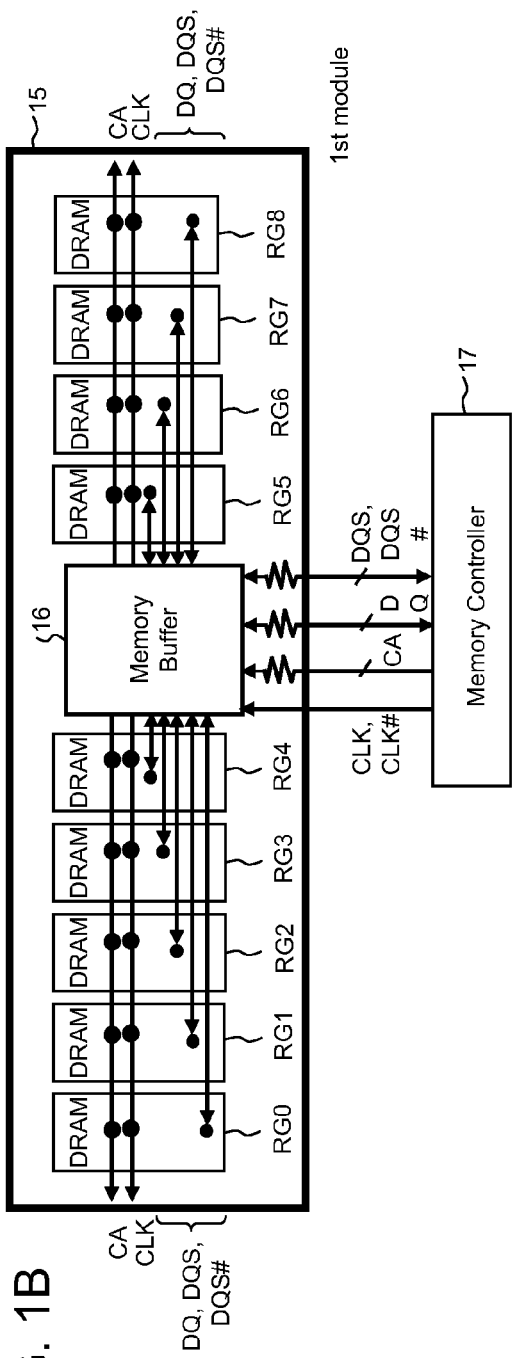

A memory system according to a first exemplary embodiment will now be described with reference to the drawings. FIGS. 1A and 1B show schematics of a configuration of a memory system according to the present exemplary embodiment.

FIG. 1A depicts a block diagram showing an example configuration of a memory system constructed in accordance with the RDIMM (Registered Dual Inline Memory Module) standard. With reference to FIG. 1A, the memory system includes a memory module and a memory controller 13. The memory module includes a module substrate 11, a plurality of memory devices, such as DRAMs, and a register 12, inclusive of a PLL. Each memory device belongs to one of a plurality of rank groups RG0 to RG8. The rank groups will be explained subsequently with reference to FIG. 2.

With reference to FIG. 1A, a command address signal (Command/Address) signal CA is supplied in common to each of the memory devices belonging to the plurality of rank groups RG0 to RG8. On the other hand, a data signal DQ and data strobe signals DQS, DQS# are individually coupled to the memory controller 13 from one rank group to another.

In the RDIMM memory system, shown in FIG. 1A, the data signal DQ is directly exchanged between the memory device, such as DRAM, and the memory controller 13. When the data signal DQ is read out from the memory device, the data signal DQ and the data strobe signal DQS are output by the memory device with the same phase to the memory controller 13. The memory controller delays the phase of the data strobe signal DQS by 90 degrees, and latches the data signal DQ with a rising or falling edge of the phase-delayed data strobe signal DQS. Similar readout operations are carried out in memory systems constructed in accordance with the UDIMM (Unbuffered DIMM) standard or with the SODIMM (Small Outline DIMM) standard.

FIG. 1B depicts a block diagram showing an example configuration of a memory system constructed in accordance with the LRDIMM (Load Reduced DIMM). With reference to FIG. 1B, the memory system includes a memory module and a memory controller 17. The memory module includes a module substrate 15, a plurality of memory devices, such as DRAMs, and a memory buffer 16. Each memory device belongs to one of the rank groups RG0 to RG8.

Again in FIG. 1B, a command address signal (Command/Address) signal CA is supplied in common to the memory devices belonging to each of the plurality of rank groups RG0 to RG8. On the other hand, a data signal DQ and data strobe signals DQS, DQS# are individually coupled to the memory controller 13 from one rank group to another.

In the LRDIMM system, shown in FIG. 1B, it is the memory buffer 16 that directly exchanges a data signal DQ of the memory device, such as DRAM, in the same way as in the memory system constructed in accordance with the FBDIMM (Fully Buffered DIMM) standard. When the data signal DQ is read out from the memory device, the data signal DQ and the data strobe signal DQS are output by the memory device with the same phase to the memory buffer 16. The memory buffer 16 delays the phase of the data strobe signal DQS by 90 degrees, and latches the data signal DQ with a rising or falling edge of the phase-delayed data strobe signal DQS. A similar readout operation is carried out in memory systems constructed in accordance with the FBDIMM standard.

Figure 2B:
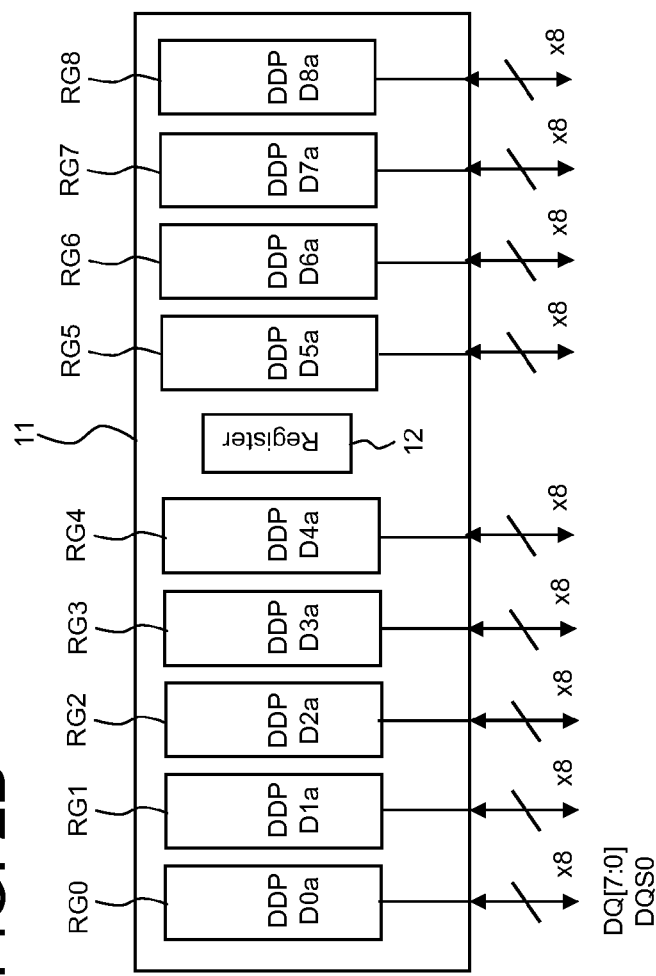
FIGS. 2A and 2B illustrate memory ranks in a memory system according to a first exemplary embodiment.
Figure 2A:
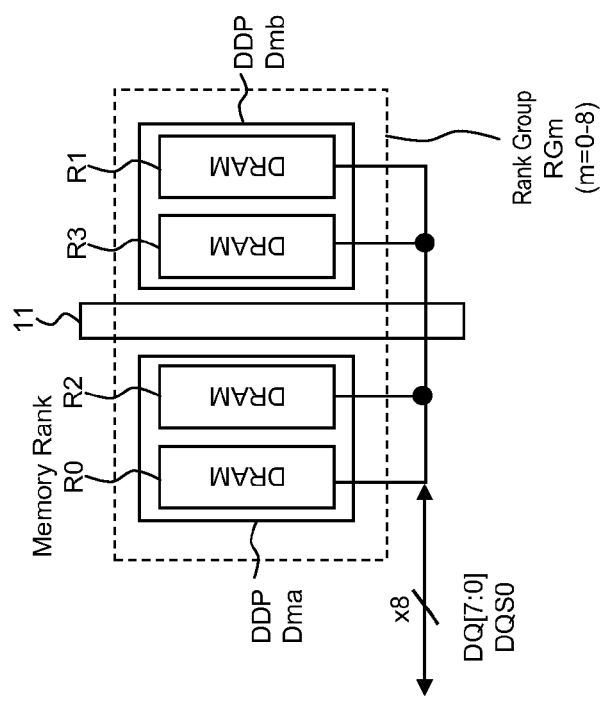

FIGS. 2A and 2B are diagrams for illustrating the memory ranks in the memory system according to the present exemplary embodiment. FIGS. 2A and 2B are respectively a cross-sectional view and a plan view of the memory system shown in FIG. 1A. FIGS. 2A and 2B show a memory system carrying, on each side of the module substrate, a plurality of DDPs (Dual Die Packages), each of which is composed by two memory devices, such as DRAMs.

With reference to FIGS. 2A and 2B, one side of the module substrate 11 carries nine DDPs D0a to D8a, while its other side carries nine DDPs D0b to D8b. The memory system, shown in FIG. 2, includes four memory ranks R0 to R3. With reference to FIG. 2A, each DDP Dma (m=0 to 8) includes a memory device with the memory rank R0 and a memory device with the memory rank R2. In a similar manner, each DDP Dmb (m=0 to 8) includes a memory device with the memory rank R1 and a memory device with the memory rank R3.

It is noted that that the memory rank means a set of a plurality of memory devices selectively driven by a chip select signal. As an example, the nine memory devices belonging to the memory rank R0 receive a chip select signal CS0, not shown, and are selectively driven in response to the chip select signal CS0. In similar manner, the nine memory devices belonging to the memory rank Rn (n=1 to 3) receive a chip select signal CSn, not shown, and are selectively driven in response to the chip select signal CSn.

With reference to FIG. 2B, the memory system includes nine rank groups RG0 to RG8. With reference to FIG. 2A, each rank group RGm (m=0 to 8) includes four memory devices belonging to different memory ranks R0 to R3.

The rank group means a set of a plurality of memory devices whose data terminals DQ and data strobe terminals DQS are connected in common to the control device, as shown in FIG. 2A. With reference to FIG. 1A, the data terminals DQ and data strobe terminals DQS of the four memory devices, belonging to the same rank group, are connected in common to the memory controller 13 corresponding to the control device. Likewise, in FIG. 1B, the data terminals DQ and data strobe terminals DQS of the four memory devices, belonging to the same rank group, are connected in common to the memory buffer 16 corresponding to the control device.

Figure 3:
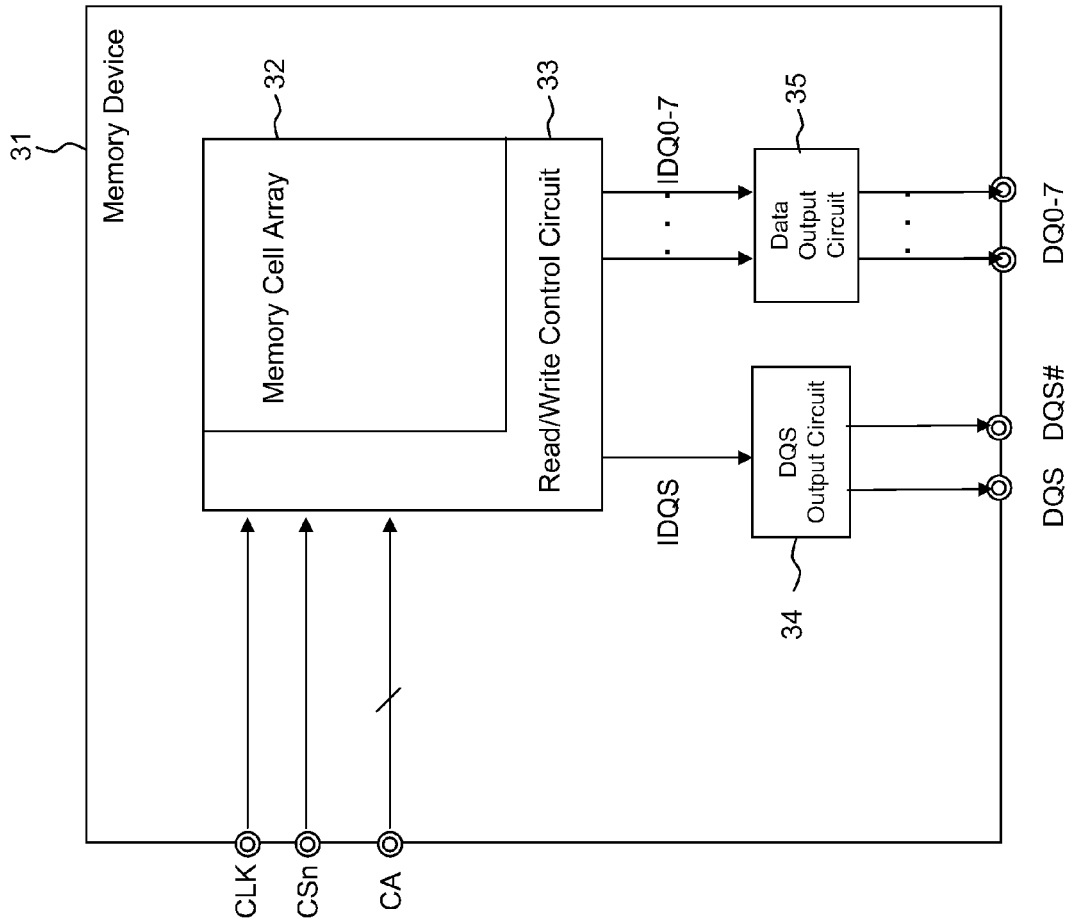
FIG. 3 is a block diagram showing an example configuration of a memory device in the memory system according to the first exemplary embodiment.

FIG. 3 depicts a block diagram showing an example configuration of a memory device 31 loaded on a memory module of the memory system according to the present exemplary embodiment. With reference to FIG. 3, the memory device 31 includes a memory cell array 32 in which a plurality of memory cells are disposed in a matrix configuration, and a read/write control circuit 33 that controls data write in memory cells of the memory cell array 32 or data readout from the memory cells. The memory device also includes a data strobe signal (DQS) output circuit 34 and a data output circuit 35. The memory device 31 also receives a clock signal CLK, a chip select signal CSn and a command address signal CA, while outputting the data strobe signals (DQS, DQS#) and data signals DQ0 to DQ7. Although there are also data and DQS input signals, just output signals here are indicated.

The memory devices belonging to the same rank group receive different chip select signals CSn depending on different memory ranks. As an example, the memory devices belonging to the memory rank R0 receive a chip select signal CS0. In a similar manner, the memory devices belonging to the memory rank Rn (n=1 to 3) receive chip select signals CSn.

The read/write control circuit 33 is activated by the chip select signal CSn which is supplied from a control device not shown in FIG. 3. When supplied with a read command from the control device, the read/write control circuit 33 provides read data to the data output circuit 35 from the memory cell specified in response to an address delivered thereto from the control device and causes the DQS output circuit 34 to generate a data strobe signal.

FIG. 4 depicts a block diagram showing an example configuration of the memory system according to the present exemplary embodiment. With reference to FIG. 4, the memory system includes a memory module 41 and a control device 42. The control device 42 includes, in turn, a control unit 43, a data input unit 44, a data processing unit 45 and a data output unit 46. The memory controller 13 in the memory system shown in FIG. 1A corresponds to the control device 42, while the memory buffer 16 in the memory system shown in FIG. 1B corresponds to the control device 42. The data output unit 46 is not essential to the present invention and hence the corresponding explanation is dispensed with.

The control unit 43 generates the command address signal CA and the clock signal CLK to deliver the so generated command address signal CA and clock signal CLK to the memory devices loaded on the memory module 41. The control unit 43 also routes a rank enable signal REn (n=0 to 3) to the data input unit 44, while routing the rank enable signal REn as corresponding chip select signal CSn to the memory devices in the corresponding memory rank Rn.

The data input unit 44 includes a plurality of data input sections DI0 to DI8. The data input sections DI0 to DI8 are respectively provided in association with the rank groups RG0 to RG8.

The data processing unit 45 sends data, supplied thereto from the data input unit 44, to an outside CPU (Central Processing Unit) and an outside MPU (Micro-Processing Unit), while sending data delivered thereto from an outside CPU or an outside MPU, as an example, to the data output unit 46.

Figure 5:
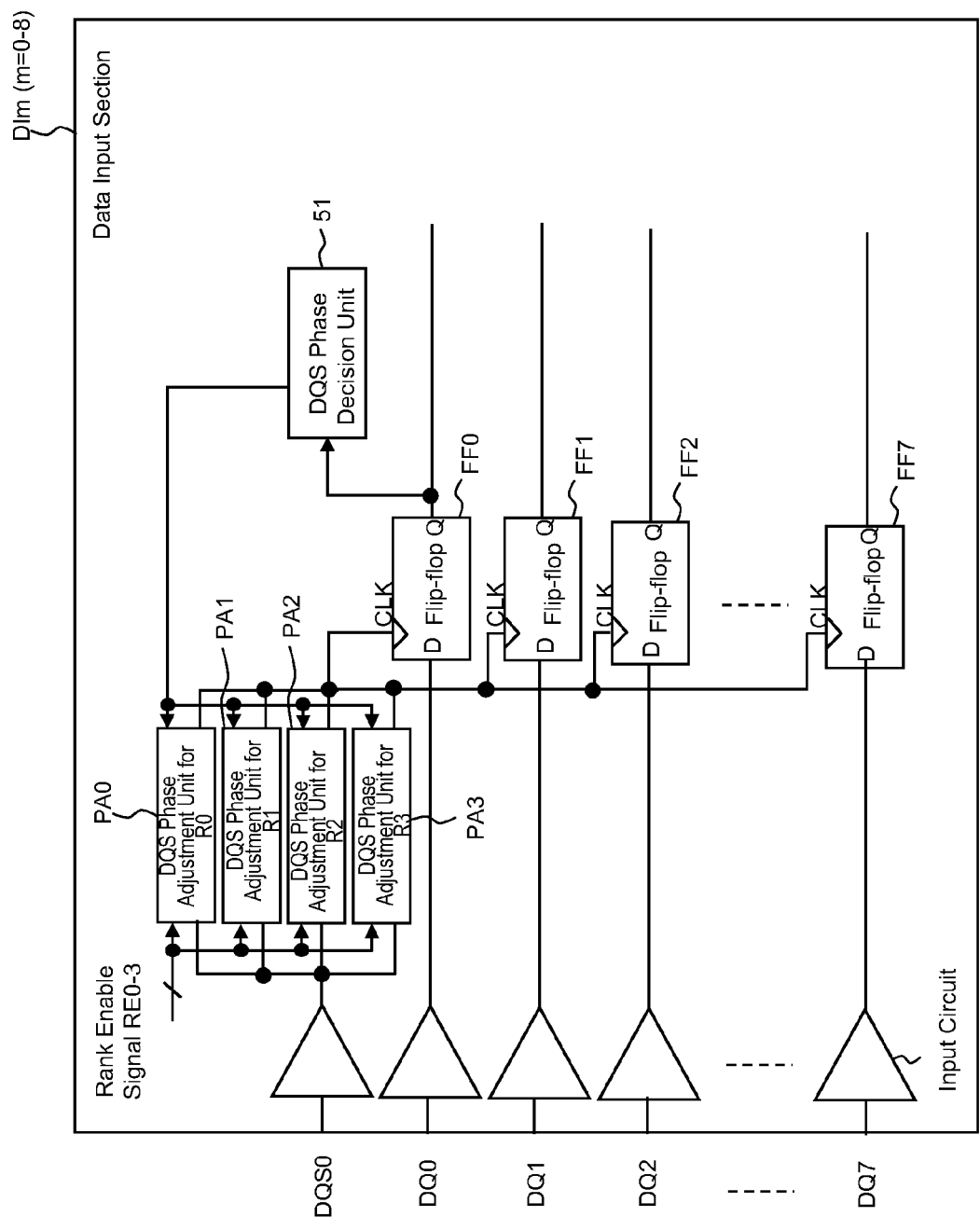
FIG. 5 is a block diagram showing an example configuration of a data input unit in the memory system according to the first exemplary embodiment.

FIG. 5 depicts a block diagram showing an example configuration of one data input section DIm (m=0 to 8) among the data input sections DI0 to DI8 included in the control device 42 shown in FIG. 4. With reference to FIG. 5, the data input section DIn includes an input circuit that receives a data strobe signal DQS0 and data signals DQ0 to DQ7, output from the memory devices, DQS phase adjustment units PA0 to PA3, flip-flops FF0 to FF7, and a DQS phase decision unit 51.

The phase adjustment units PA0 to PA3 are respectively provided in association with the memory ranks R0 to R3. The phase adjustment units PA0 to PA3 hold DQS delay values from one memory rank to another. On receipt of the data strobe signal DQS0, the phase adjustment units adjust the phase of the data strobe signal DQS0 received, in keeping with the DQS delay value, and outputs the phase-adjusted data strobe signal DQS0 to the flip-flops FF0 to FF7. In case the control device 42 requests the memory devices to read out data, one of the DQS phase adjustment units is activated in keeping with the one of the rank enable signals RE0 to RE3 supplied from the control unit 43, and the data strobe signal DQS0 is delayed by a delay time corresponding to the memory rank under read operation. The DQS phase adjustment units PAn (n=0 to 3) will be explained later on in detail with reference to FIG. 6.

The flip-flops FF0 to FF7 are provided in association with data input terminals DQ0 to DQ7, and are responsive to the phase-adjusted data strobe signal, delivered from one of the DQS phase adjustment units PA0 to PA3, to latch data at the data input terminal. Specifically, the flip-flops FFj (j=0 to 7) latch the data signal, received from, the data input terminal DQj, in synchronization with a rising or falling edge of the phase-adjusted data strobe signal output from the DQS phase adjustment unit PAn for the memory rank Rn selected by the rank enable signal REn (n=0 to 3). Also, the flip-flop FF0, connected to the data input terminal DQ0, routes the data signal to the DQS phase decision unit 51 during training of the data strobe signal DQS0.

During training of the data strobe signal DQS0, the DQS phase decision unit 51 routes the results of training of the flip-flop FF0, supplied from the flip-flop FF0 connected to the data input terminal DQ0, to the DQS phase adjustment unit PAn, among the DQS phase adjustment units PA0 to PA3, which corresponds to the memory rank Rn (n=0 to 3) under training. The detailed configuration of the DQS phase decision unit 51 will be explained subsequently with reference to FIG. 7.

Figure 6:
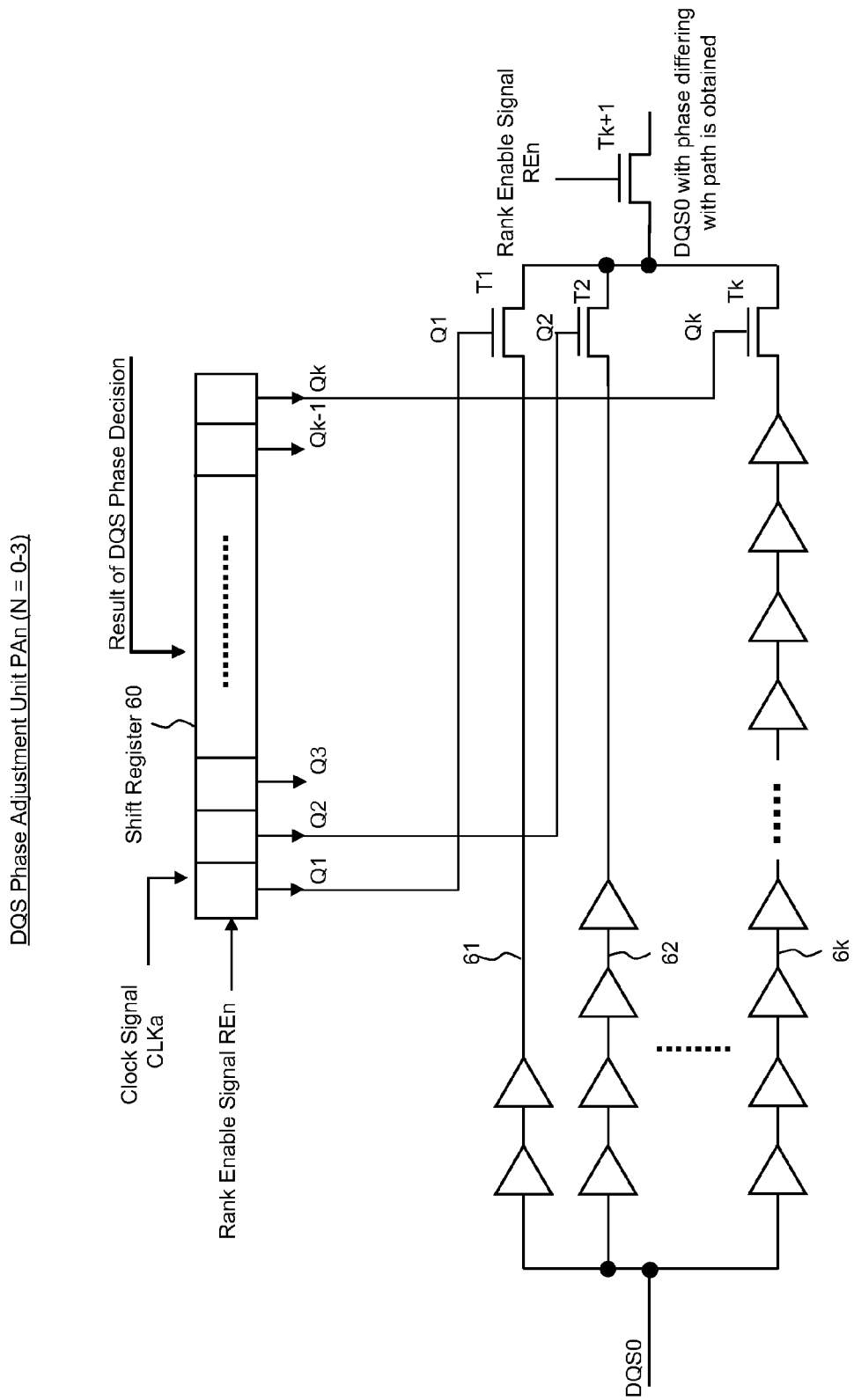
FIG. 6 is a block diagram showing an example configuration of a DQS phase adjustment unit in the memory system according to the first exemplary embodiment.

FIG. 6 depicts a circuit diagram showing an example configuration of the DQS phase adjustment unit PAn (n=0 to 3). With reference to FIG. 6, the DQS phase adjustment unit PAn includes a k-number of stages of a shift register 60, a k-number of delay lines 6*l* to 6*k* and a (k+1)-number of transistors T1 to Tk+1. The delay lines 6*l* to 6*k* delay the data strobe signal DQS0 by a plurality of respective different delay time values to output the resulting delayed signals. The shift register 60 receives the rank enable signal REn and holds the so received rank enable signal REn as it shifts the received signal in keeping with a clock signal CLKa. The gate terminal of each of the transistors T1 to Tk is supplied with a signal Qk held by each stage of the shift register 60. The gate terminal of the transistor Tk+1 is fed with the rank enable signal REn. The DQS phase adjustment unit PAn outputs to the flip-flops FF0 to FF7 a signal output from one of the delay lines 6*l* to 6*k*.

In case the shift register 60 has received a signal '1' as the rank enable signal REn, the signal '1' is shifted on the shift register 60 in response to the clock signal CLKa. This causes the transistors T1 to Tk to be turned on in the sequence of T1, T2, Tk. The DQS phase adjustment units PAn outputs a signal, from among the data strobe signals DQS0 passed through the delay lines 6*l* to 6*k*, which has passed through the delay line 6*i* connected to the transistor Ti (i=1 to k) that has been turned on. That is, with the DQS phase adjustment units PAn, it becomes possible to sweep the data strobe signal DQS0 to generate a plurality of data strobe signals, differing in the phase values from one another, and to supply the so generated data strobe signals to the flip-flops FF0 to FF7.

Figure 7:
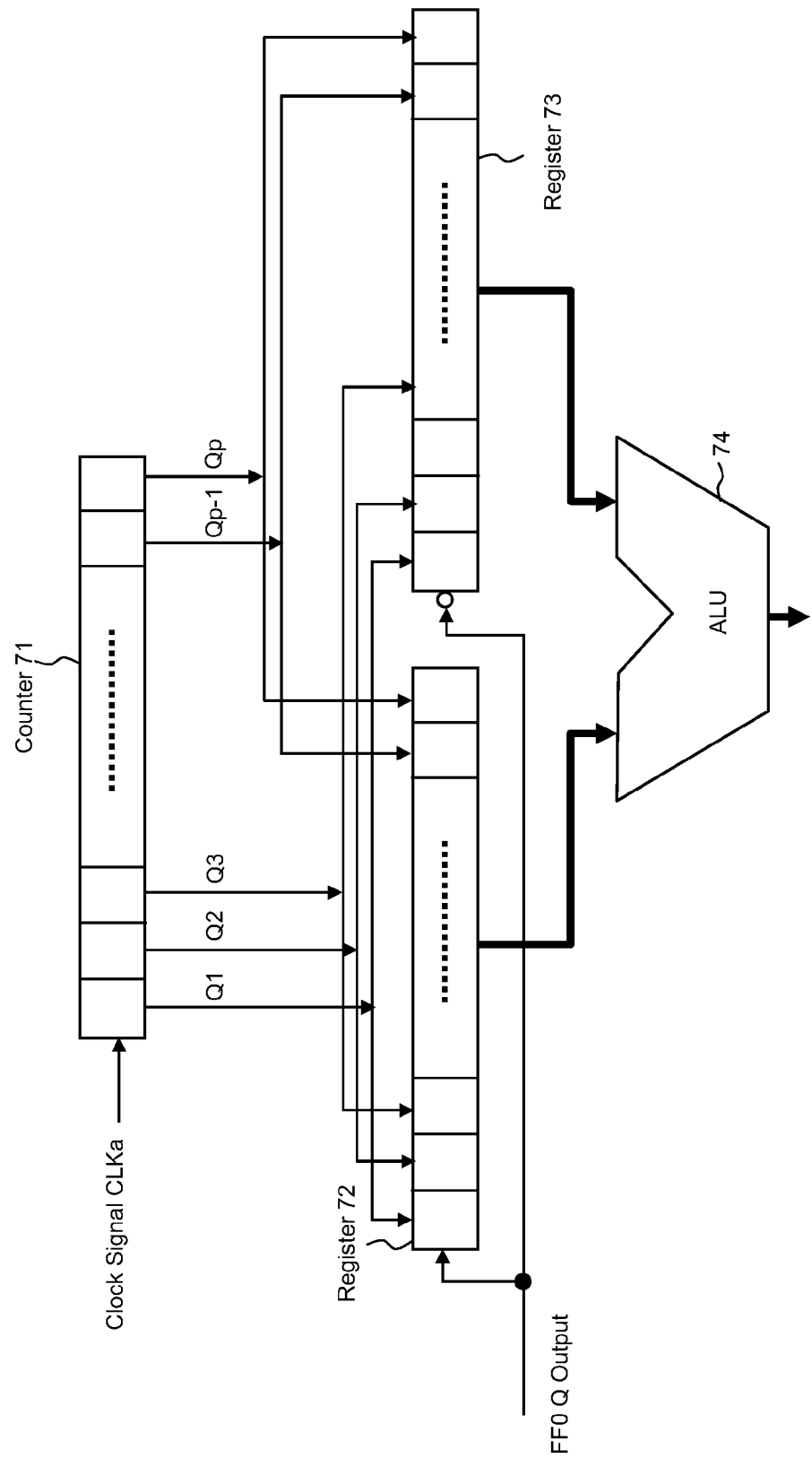
FIG. 7 is a block diagram showing an example configuration of a DQS phase decision unit in the memory system according to the first exemplary embodiment.

FIG. 7 shows an example configuration of the DQS phase decision unit 51. With reference to FIG. 7, the DQS phase decision unit 51 includes a counter 71, registers 72, 73 and an ALU (Arithmetic Logic Unit) 74.

The counter 71 performs a count operation in response to the clock signal CLKa. The register 72 holds a count value of the counter 71 when a signal output from the flip-flop FF0 has moved from a first level (for example, a low level) to a second level (for example, a high level). On the other hand, the register 72 holds a count value of the counter 71 when a signal output from the flip-flop F0 has shifted from the second level (high level) to the first level (low level). The ALU 74 calculates an average value between the count value held by the register 72 and the count value held by the register 73. The DQS phase decision unit 51 feeds back the so calculated average value to the DQS phase adjustment units PA0 to PA3.

Returning to FIG. 6, the DQS phase adjustment units PA0 to PA3 select the transistor Tj, which should be turned on, in response to the average value as calculated by the DQS phase decision unit 51, such as to decide on the value of phase adjustment of the data strobe signal DQS0.

Figure 8:
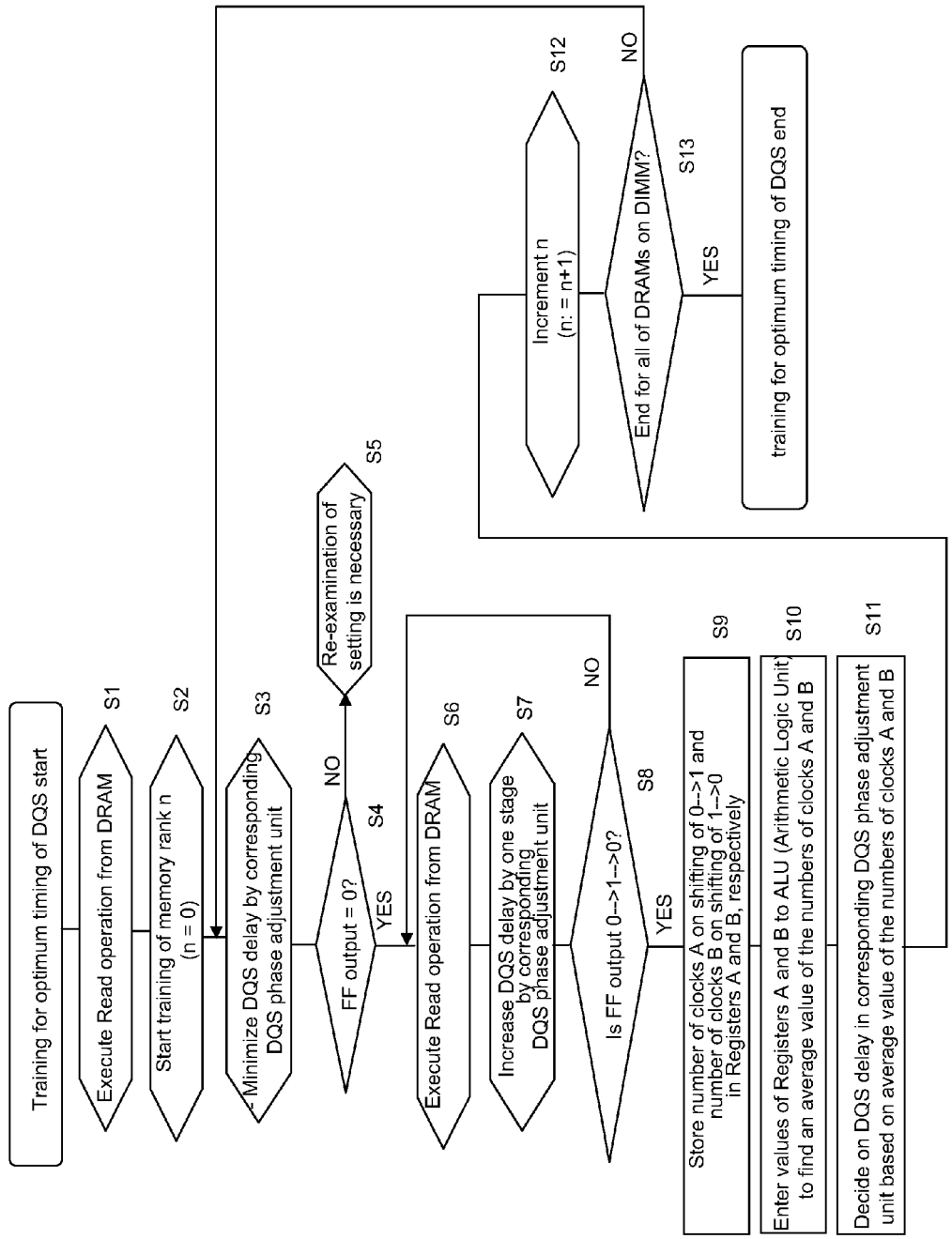
FIG. 8 is a flowchart showing an example operation of a control device in the memory system according to the first exemplary embodiment.

FIG. 8 depicts a flowchart for illustrating an example data strobe signal DQS training operation in the memory system of the present exemplary embodiment. A training operation will now be explained with reference to FIG. 8.

Initially, a read operation from memory devices, such as DRAMs, is carried out (step S1 of FIG. 8). Training of the data strobe signal DQS for the memory devices with the memory rank Rn (n=0) is then started (step S2). Then, in the DQS phase adjustment unit PA0 for the memory rank R0, delay of the data strobe signal DQS is minimized (step S3). It is then checked whether or not the output signal from the flip-flop FF0 is zero (step S4). In case the output signal of the flip-flop FF0 is not zero (No of step S4), setting is re-examined (step S5).

On the other hand, if the output signal from the flip-flop FF0 is zero (Yes in step S4), the read operation from the memory devices is carried out (step S6). The delay value of the data strobe signal is then increased one step in the DQS phase adjustment unit PA0 (step S7). The DQS phase decision unit 51 then checks whether or not the output signal from the flip-flop FF0 has shifted from 0 to 1 and then has further shifted from 1 to 0 (step S8). If the output signal of the flip-flop FF0 has not made a shift of 0→1→0 (No of step S8), processing reverts to step S6.

If conversely the output signal of the flip-flop FF0 has made a shift of 0→1→0 (Yes of step S8), the DQS phase decision unit 51 stores, in the register 72, a count value A of the clock signal CLKa when the output signal of the flip-flop FF0 has shifted from 0 to 1, while storing, in the register 73, a count value B of the clock signal CLKa when the output signal of the flip-flop FF has shifted from 1 to 0 (step S9). The DQS phase decision unit 51 then calculates, using the ALU 74, an average value between the count value A held by the register 72 and the count value 13 held by the register 73 (step S10). The DQS phase adjustment unit PA0 then determines the phase delay of the data strobe signal DQS based on the average value as calculated by the DQS phase decision unit 51 (step S11).

Then, to start the training operation for the data strobe signal DQS for the memory devices of the memory rank Rn (n=1), the index n is incremented by one (step S12). Then, for the total of the memory devices on the DIMM, that is, for a sum total of 36 memory devices of the memory ranks R0 to R3 of the total of the rank groups of RG0 to RG8, it is checked whether or not the training of the data strobe signal has come to an end (step S13). If the training has not come to an end for the total of the memory devices (No of step S13), processing reverts to step S13. If conversely the training has come to an end for the total of the memory devices (Yes of step S13), the training of the data strobe signal comes to an end.

Figure 9:
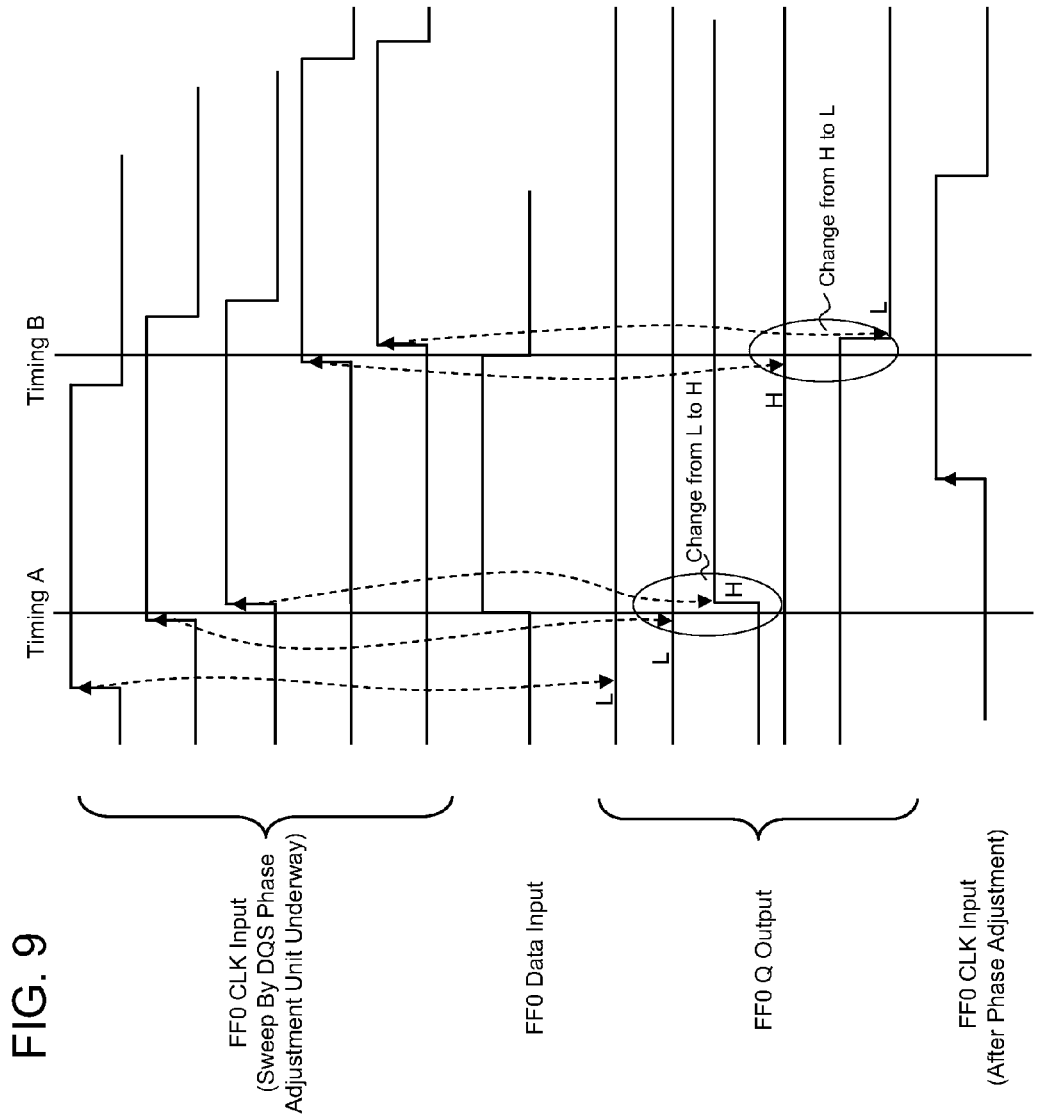
FIG. 9 is a waveform diagram for illustrating an operation of the control device in the memory system according to the first exemplary embodiment.

FIG. 9 depicts a waveform diagram for signals during training of the data strobe signal. There are shown in FIG. 9 an input signal 'FF0 CLK input' to the clock input terminal CLK of the flip-flop FF0 and an 'input signal 'FF0 Data Input' to the data input terminal D of the flip-flop FF0. There are also shown in FIG. 9 an output signal 'FF0 Q Output' from the output terminal Q of the flip-flop FF0 and an input signal 'FF0 CLK input' to the clock input signal CLK of the flip-flop FF0 following the phase adjustment.

With reference to FIG. 9, the data strobe signal DQS0, swept by the DQS phase adjustment unit PAn (n=1 to 3), is supplied as the input signal 'FF0 CLK' to the input terminal CLK of the flip-flop FF0 (steps S0 to S8 of FIG. 8). It is here assumed that the data signal, shifted from 0 to 1 in the timing A and from 1 to 0 in the timing B, is delivered as the input signal (FF0 Data Input) to the data input terminal. It is also assumed that the flip-flop FF0 latches the input signal supplied to the data input terminal D in synchronization with a rising edge of the data strobe signal delivered to the clock input terminal.

With reference to 'FF0 Q Output' of FIG. 9, if the phase of the data strobe signal DQS0 is adjusted, and the rising edge of the signal supplied to the clock terminal CLK of the flip-flop FF0 is immediately in rear of the timing A, the output signal of the data output terminal Q of the flip-flop FF0 is shifted from 0 to 1 (from L to H). If the phase of the data strobe signal DQS0 is adjusted further, and the rising edge of the signal supplied to the clock terminal CLK of the flip-flop FF0 is immediately in rear of the timing B, the output signal of the data output terminal Q of the flip-flop FF0 is shifted from 1 to 0 (from H to L) (Yes of step S8 of FIG. 8).

In this case, the DQS phase decision unit 51 determines an intermediate timing between the timing when the output signal of the flip-flop FF0 has shifted from 0 to 1 and the timing when the output signal of the flip-flop FF0 has shifted from 1 to 0. The DQS phase decision unit feeds back the so determined intermediate timing to the DQS phase adjustment unit PAn (n=0 to 3) (step S10 of FIG. 8).

Thus, as indicated at the lowermost part of FIG. 9 'FF0 CLK input', the position of the rising edge of the data strobe signal DQS0, supplied to the clock terminal CLK of the flip-flop FF0, may be adjusted to the center position of the timing when the data signal DQ0 shifts from 0 to 1 and the timing when it shifts from 1 to 0 (step S11 of FIG. 8).

With the memory system of the present exemplary embodiment, it is possible to adjust the phase of the data strobe signal independently for respective memory devices belonging to the same rank group. Therefore, it is possible to improve a margin in receiving, by the control device, the data delivered from each of the memories belonging to the same rank group.

Second Exemplary Embodiment

A memory system according to a second exemplary embodiment will be explained with reference to the drawings. A configuration of the memory system according to the present exemplary embodiment only differs from the first exemplary embodiment as to the configuration of the data input sections DI0 to DI8 included in the data input unit 44 of the control device 42. Otherwise, the configuration of the memory system according to the present exemplary embodiment is similar to that of the memory system of the first exemplary embodiment (FIG. 4).

In the memory system of the first exemplary embodiment, the delay time of the data strobe signal DQS is adjusted using a data input timing at the data terminal DQ0. In the present exemplary embodiment, the delay time of the data strobe signal DQS is adjusted using the data input timing at the total of the data terminals DQ0 to DQ7.

Figure 10:
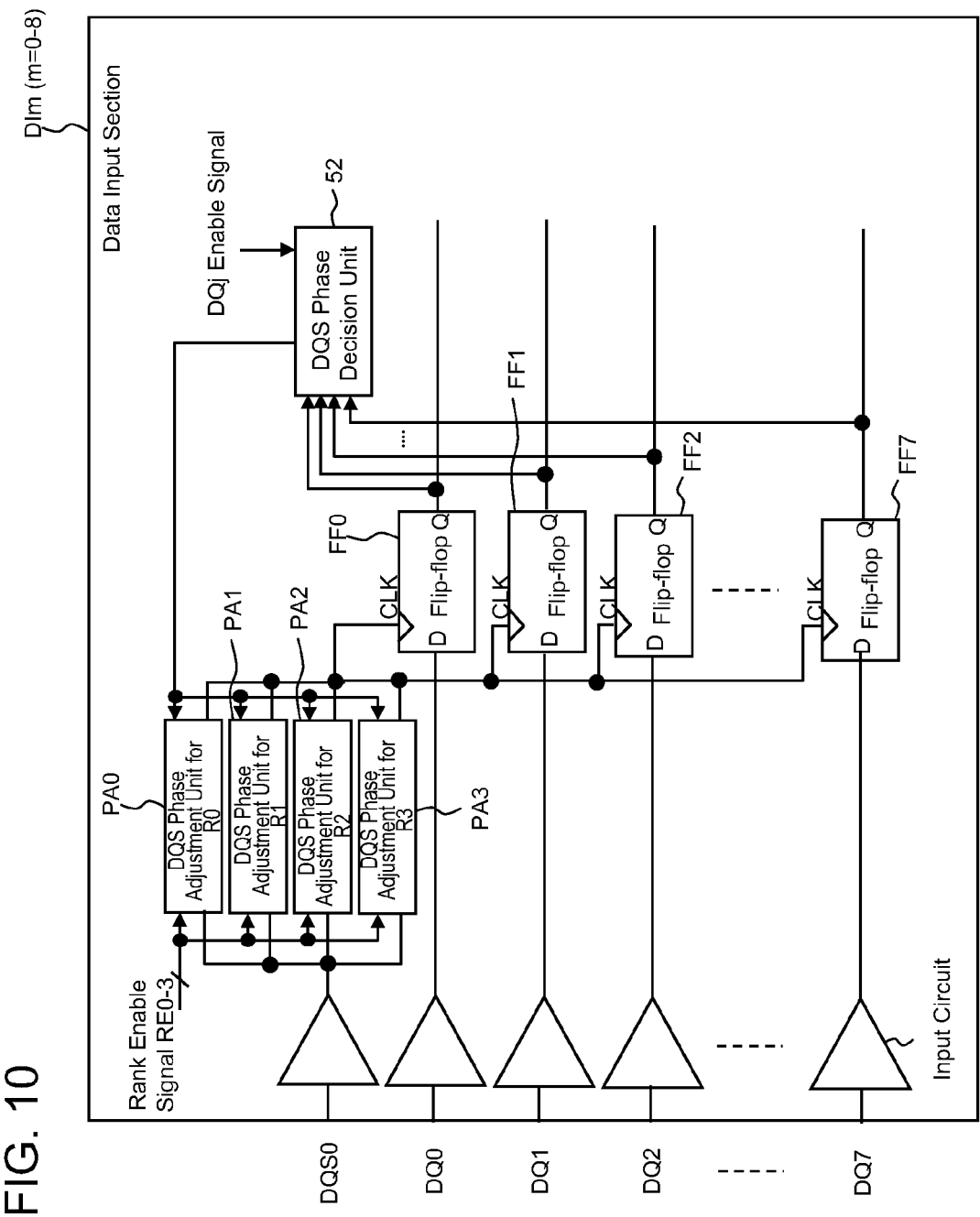
FIG. 10 is a block diagram showing an example configuration of a data input unit in a memory system according to a second exemplary embodiment.

FIG. 10 depicts a block diagram showing an example configuration of a data input section DIm (m=0 to 8) provided in the control device 42 of the present exemplary embodiment (see FIG. 4). With reference to FIG. 10, the data input section DIm includes an input circuit to receive the data strobe signal DQS0 and the data signals DQ0 to DQ7 output from the memory devices. The data input section DIm also includes DQS phase adjustment units PA0 to PA3, flip-flops FF0 to FF7 and a DQS phase decision unit 52.

The DQS phase adjustment units PA0 to PA3 are provided in association with the memory ranks R0 to R3, respectively. The DQS phase adjustment units PA0 to PA3 hold the DQS delay value from one memory rank to another and, on receipt of the data strobe signal DQS0, adjust the phase of the data strobe signal DQS0 received, in keeping with the DQS delay value, from one memory value to another, such as to output the phase-adjusted data strobe signal DQS0 to the flip-flops FF0 to FF7. When the control device 42 requests the memory devices to read, one of the DQS phase adjustment units is activated in response to the rank enable signals RE0 to RE3, delivered from the control unit 43, such as to delay the data strobe signal DQS0 by a delay time value corresponding to the memory rank of the memory devices being read. It is noted that the configuration explained with reference to FIG. 6 may be used as the configuration of the DQS phase adjustment unit PAn (n=0 to 3).

The flip-flops FF0 to FF7 are provided in association with the data input terminals DQ0 to DQ7, respectively, and latch data at the data input terminal in keeping with the phase-adjusted data strobe signal delivered from one of the DQS phase adjustment units PA0 to PA3. Specifically, the flip-flop FFj (j=0 to 7) latches the data signal, received from the data input terminal DQj, in synchronization with the rising or falling edge of the phase-adjusted data strobe signal output from the DQS phase adjustment unit PAn for the memory rank Rn as selected by the rank enable signal REn (n=0 to 3). The flip-flops FF0 to FF7 also deliver the data signal to the DQS phase decision unit 52 during training of the data strobe signal DQS0.

During the training of the data strobe signal DQS0, the DQS phase decision unit 52 routes the training results, supplied from the flip-flops FF0 to FF7, to the phase adjustment unit PAn, from among the DQS phase adjustment units PA0 to PA3, which corresponds to the memory rank Rn (n=0 to 3) under training. It is noted that the detailed configuration of the DQS phase decision unit 52 will be explained later with reference to FIG. 11.

Figure 11:
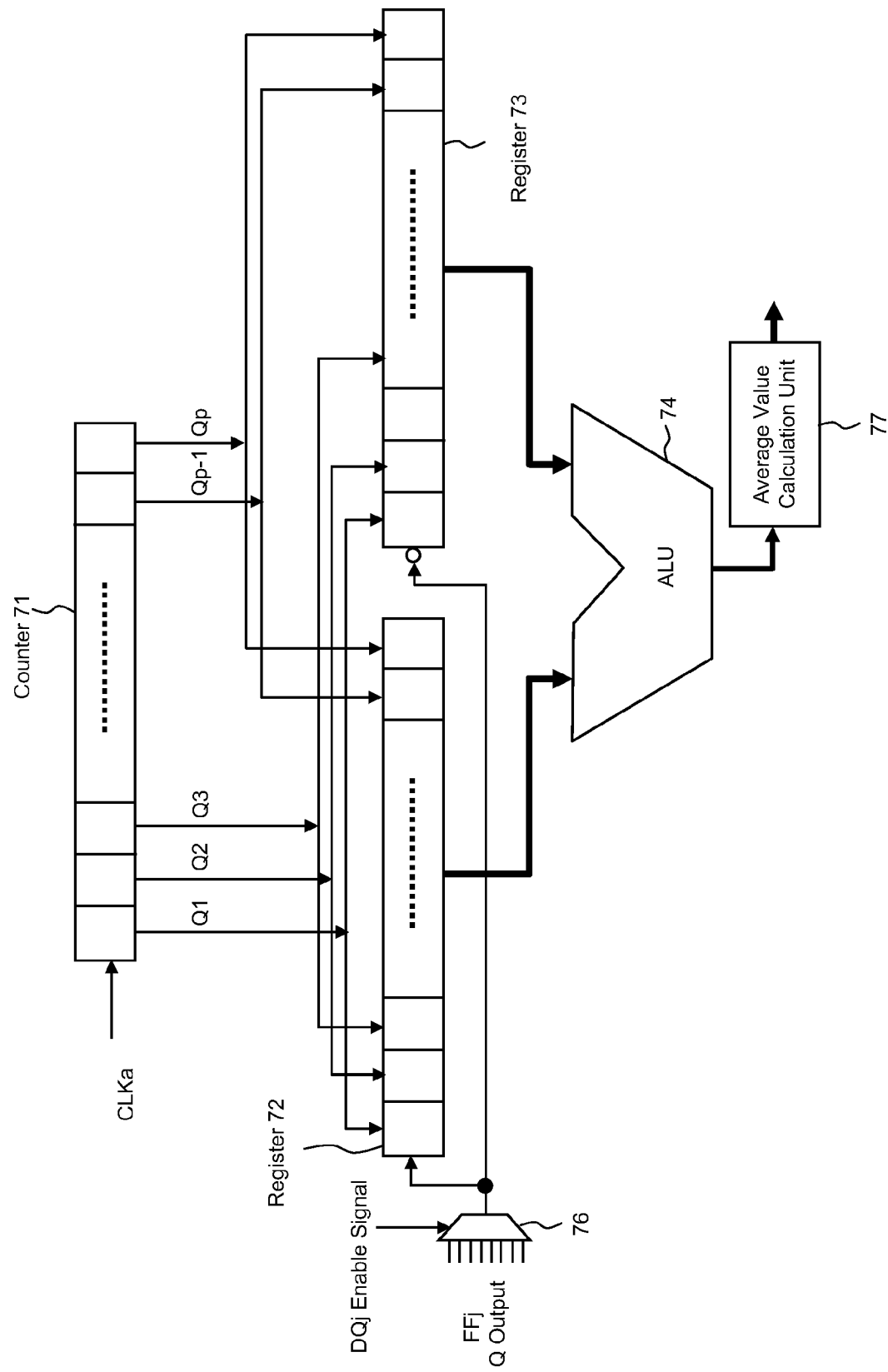
FIG. 11 is a block diagram showing an example configuration of a DQS phase decision unit in the memory system according to the second exemplary embodiment.

FIG. 11 depicts a block diagram showing an example configuration of the DQS phase decision unit 52 provided in the data input section DIm (m=0 to 8) of the memory system of the present exemplary embodiment. With reference to FIG. 11, the DQS phase decision unit 52 includes a counter (Counter) 71, registers 72, 73, an arithmetic logic circuit (ALU) 74, a selector 76 and an average value calculation unit 77.

The counter 71 carries out a count operation in response to the clock signal CLKa. The selector 76 is responsive to a data signal enable signal DQj (j=0 to 7) to select an output signal of the flip-flop FFj, from among the flip-flops FF0 to FF7, to output the so selected signal to the registers 72 and 73. The register 72 holds a count value of the counter 71 when a signal output from the flip-flop FFj has shifted from a first level (for example, a low level) to a second level (for example, a high level). On the other hand, the register 73 holds a count value of the counter 71 when a signal output from the flip-flop FFj has shifted from the second level (high level) to the first level (low level). The ALU 74 calculates an average value between the count value as held by the register 72 and that as held by the register 73 to output the so calculated average value to the average value calculation unit 77. The average value calculation unit 77 holds the average value for each flip-flop FFj (j=0 to 7), output from the ALU 74, in its register, and finds a mean value of the average values obtained on averaging the average values from the flip-flops FF0 to FF7. The average value calculation unit 77 then feeds back the as-found mean value to the DQS phase adjustment units PA0 to PA3.

With reference to FIG. 6, each of the DQS phase adjustment units PA0 to PA3 selects, depending on the average value as calculated by the average value calculation unit 77 of the DQS phase decision unit 52, the transistor Ti (i=1 to k) which is to be turned on, and accordingly determines the value of phase adjustment of the data strobe signal DQS0.

As described above, in the memory system according to the present exemplary embodiment, training of the data strobe signal DQS is carried out as the total of the data signals DQ0 to DQ7, output from the memory devices, is taken into account. Thus, in the memory system of the present exemplary embodiment, the phase of the data strobe signal DQS can be adjusted such that the total of the data signals DQ will be adequately latched. Hence, in the memory system of the present exemplary embodiment, the timing margin can be improved further in comparison with the memory system of the first exemplary embodiment.

Third Exemplary Embodiment

A memory system according to a third exemplary embodiment will now be explained with reference to the drawings. The configuration of the memory system of the present exemplary embodiment is similar to that of the first or second exemplary embodiment (FIG. 4), except that, in the present exemplary embodiment, the data input sections DI0 to DI8, provided in the data input section 44 of the control device 42, differs in its configuration from the first or second exemplary embodiment.

In the memory system of the second exemplary embodiment, the delay time of the data strobe signal DQS is adjusted using the average value of the data input timing values of the total of the data terminals DQ0 to DQ7. In the present exemplary embodiment, the delay time of the data strobe signal DQS in each of the data terminals DQ0 to DQ7 is separately adjusted using the data input/output timing values of the data terminals DQ0 to DQ7.

Figure 12:
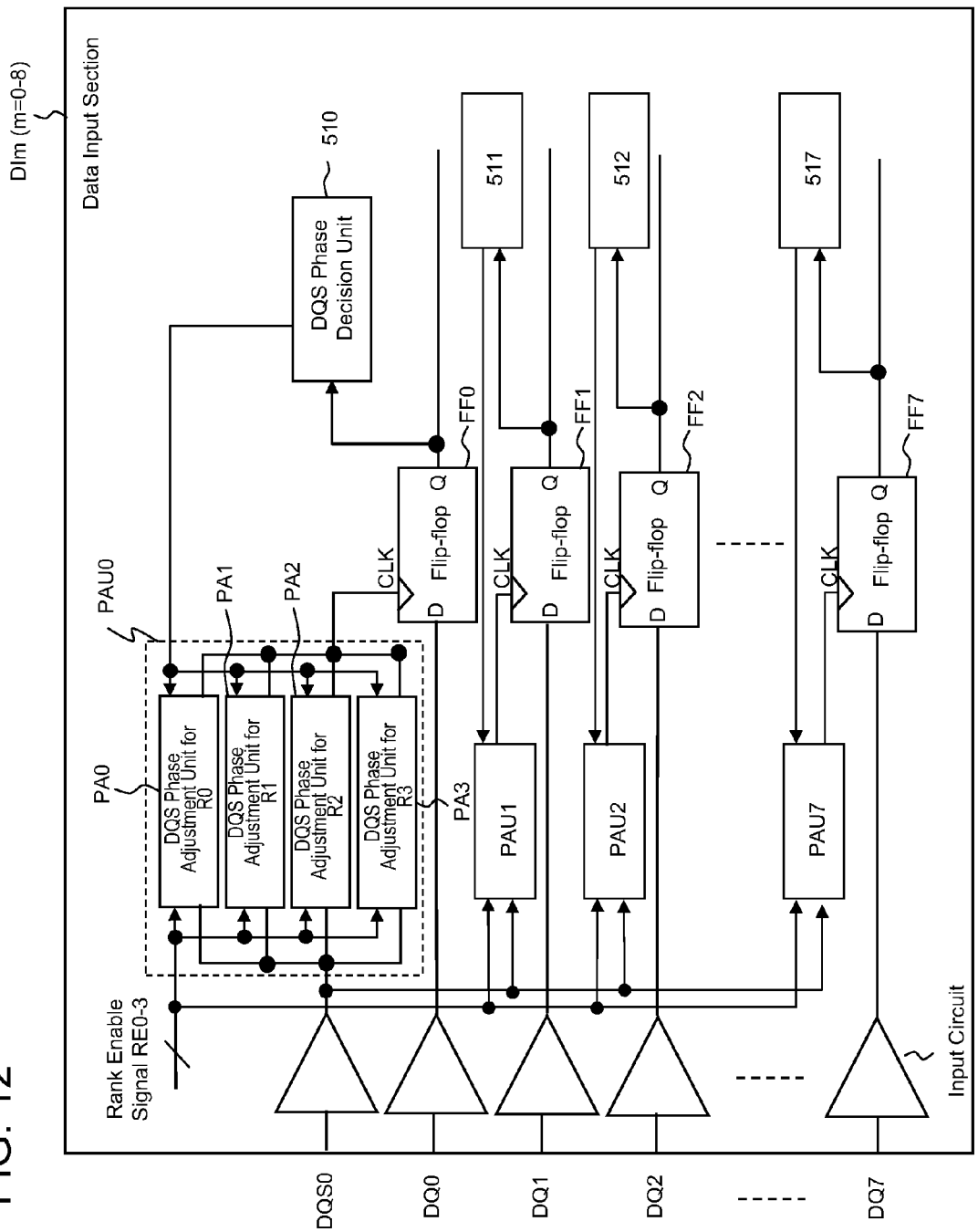
FIG. 12 is a block diagram showing an example configuration of a data input unit in the memory system according to a third exemplary embodiment.

FIG. 12 shows an example configuration of the data input/output section DIm (m=0 to 8) provided in the control device 42 in the present exemplary embodiment. With reference to FIG. 12, the data input/output section DIm includes DQS phase adjustment units PAU0 to PAU7 and DQS phase decision units 510 to 517 in association respectively with the data terminals DQ0 to DQ7. Each of the DQS phase adjustment units PAU0 to PAU7 includes the DQS phase adjustment units PA0 to PA3 shown in FIG. 5. Each of the DQS phase decision units 510 to 517 has the configuration which is substantially the same as the DQS phase decision unit 51 shown in FIG. 5.

The DQS phase adjustment unit PAUj (j=0 to 7), shown in FIG. 12, holds the results of the training from the corresponding phase decision unit 51j (j=0 to 7), as the DQS delay value from one memory rank to another. On receipt of the data strobe signal DQS0 and the rank enable signal RE0 to RE3, the DQS phase adjustment unit adjusts the phase of the received data strobe signal DQS0 depending on the DQS delay value of the memory rank as selected by the rank enable signal. The DQS phase adjustment unit outputs the phase-adjusted data strobe signal DQS0 to the flip-flops FFj (j=0 to 7).

As described above, in the memory system of the present exemplary embodiment, the training of the data strobe signal DQS is carried out separately for each of the data terminals, as the total of the data signals DQ0 to DQ7, output from the memory devices, is individually taken into account. Thus, in the memory system of the present exemplary embodiment, the data strobe signal DQS can be phase-adjusted so that the total of the data signals DQ can be latched adequately.

Modifications

The memory system of the above described exemplary embodiments may be modified in many ways. In the above described exemplary embodiments, a dual die package (DDP), including memory devices of memory ranks R0, R2, provided overlapping with each other, is arranged on one surface of the module substrate 11, while another DDP, including memory devices of memory ranks R0, R2, provided overlapping with each other, is arranged on its opposite surface, as shown in FIG. 2A. However, the arrangement of the memory devices of the memory ranks R0 to R3 is not limited to the mode shown in FIG. 2A.

Figure 13:
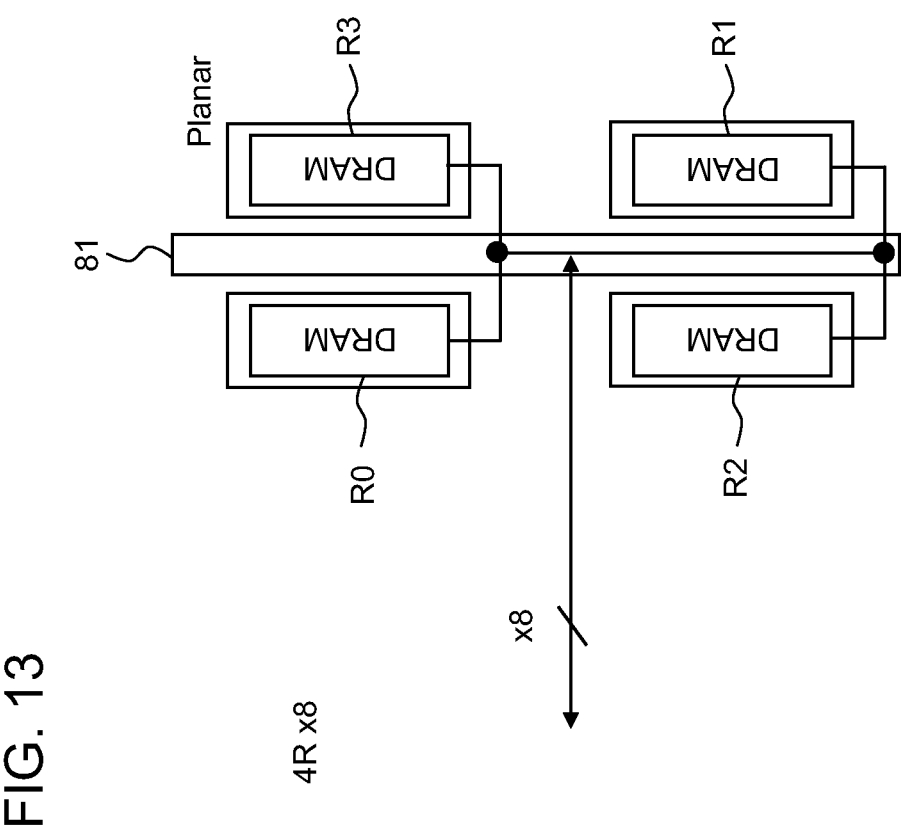
FIG. 13 illustrates memory ranks in a memory system according to a modification.

FIG. 13 shows another example arrangement of memory devices of a plurality of memory ranks. With reference to FIG. 13, memory devices, such as DRAMs, of the memory ranks R0, R2 are arranged in an up-and-down direction on one surface of a module substrate 81, while memory devices of the memory ranks R1, R3 are arranged in an up-and-down direction on its opposite surface. That is, the arrangements of the memory devices, shown in FIGS. 2A and 13, are merely illustrative, such that, in the present invention, the arrangements of the memory devices belonging to each of a plurality of memory ranks are not limited to any particular arrangements.

In the above explanation of the exemplary embodiments, it is assumed that the number of memory ranks is four, and the configuration is the number of I/Os×8. However, in the present invention, the number of memory ranks or that of I/Os is not limited to these values, For example, the number of the memory ranks may be 2 or 8, while the number of I/Os may be ×4 or ×16.

The present invention relates to a control device, a memory system and a memory module. According to the above explanation of the exemplary embodiments, the memory system and the memory module can be provided in addition to the control device.

In one aspect of the embodiment, there may be provided a memory system that comprises a memory module including a plurality of memory devices each including a data strobe terminal to communicate a data strobe information, a module substrate on which the memory module are mounted, and a control device controlling the memory module, and including, a data strobe input terminal connected in common to the data strobe terminals of the memory devices to communicate the data strobe information with the memory module, and a data input unit including, a plurality of sub-units each coupled to the data strobe terminal and each holding a data strobe delay value corresponding to an associated one of the memory devices, the data strobe delay values of the sub-units being independent from each other.

In one aspect of the embodiment, there may be provided a memory module that comprises a plurality of first memory devices ranked in a first rank group and each including a first data strobe terminal, and a control device controlling the first memory devices and including, a first data strobe input terminal connected in common to the first data strobe terminals of the first memory devices, and a plurality of first sub-units each coupled to the first data strobe input terminal and each holding a data strobe delay value corresponding to an associated one of the first memory devices, the data strobe delay values of the first sub-units being independent from each other.

Furthermore, the memory module may further comprise a plurality of second memory devices ranked in a second rank group and each including a second data strobe terminal, the first and second rank groups being different from each other, and the control device controlling the second memory devices and including, a second data strobe input terminal connected in common to the second data strobe terminals of the second memory devices, and a plurality of second sub-units each coupled to the second data strobe input terminal and each holding a data strobe delay value corresponding to an associated one of the second memory devices, the data strobe delay values of the second sub-units being independent from each other.

The entire disclosures of the above Patent Literatures are incorporated herein by reference thereto. Modifications and adjustments of the exemplary embodiment are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept. Particularly, any numerical range disclosed herein should be interpreted that any intermediate values or subranges falling within the disclosed range are also concretely disclosed even without specific recital thereof.

What is claimed is:

1. A control device comprising:
    a first data strobe input terminal to be connected in common to data strobe terminals that are included respectively in first memory devices;
    a plurality of first sub-units each coupled to the first data strobe input terminal and each holding a data strobe delay value corresponding to an associated one of the first memory devices, and the data strobe delay values of the sub-units being independent from each other;
    a first data input terminal to be connected in common to data terminals that are included respectively in the first memory devices; and a first phase detector coupled to the first data input terminal and a common output terminal of the first sub-units;

wherein the first phase detector is configured to detect a phase of a data strobe signal supplied via the first data strobe input terminal in response to a data signal supplied via the first data input terminal, so that each of the sub-units holds the data strobe delay value corresponding to the associated one of the first memory devices.

2. The control device according to claim 1, wherein the phase detector comprises:

a latch circuit coupled to the first data input terminal and latching the data signal supplied via the data input terminal in response to the data strobe signal supplied via the output terminal of the first sub-units.

3. The control device according to claim 1, wherein the first memory devices to which the first data strobe input terminal is connected in common are ranked differently from one another.

4. The control device according to claim 1, further comprising:

a second data strobe input terminal to be connected in common to data strobe terminals that are included respectively in second memory devices; and a plurality of second sub-units each coupled to the second data strobe input terminal and each holding a data strobe delay value corresponding to an associated one of the second memory devices, the data strobe delay values of the sub-units being independent from each other.

5. The control device according to claim 4, wherein the first memory devices to which the first data strobe input terminal is connected in common belongs to a first rank group having at least first and second ranks, the first and second ranks being different from each other, and wherein the second memory devices to which the second data strobe input terminal is connected in common belongs to a second rank group having the at least first and second ranks, the first and second rank groups being different from each other, and wherein a first one of the first memory devices is ranked in the first rank of the first rank group, a second one of the first memory devices is ranked in the second rank of the first rank group, a first one of the second memory devices is ranked in the first rank of the second rank group, and a second one of the second memory devices is ranked in the second rank of the second rank group.

6. A control device, comprising:

a data strobe input terminal connected in common to data strobe terminals of a plurality of memory devices, wherein the memory devices belong to different ones of a plurality of memory ranks;

a data input unit configured to hold a plurality of data strobe delay values, the data strobe delay values being independent from each other and corresponding to each of the memory devices, wherein the data input unit adjusts a phase of a data strobe signal, supplied from one of the memory devices, depending on a data strobe delay value that is selected from among the data strobe delay values and corresponds to the one of the memory device;

the data input unit being further configured to latch a data signal received from the one of the memory device via the data strobe input terminal depending on the adjusted data strobe signal; and a control unit that supplies to the data input unit a rank enable signal for selecting one of the memory ranks;

wherein the data input unit comprises:

a plurality of DQS phase adjustment units provided in association with each of the memory ranks, wherein the DQS phase adjustment units receive the data strobe signal and adjust a phase thereof to output a resulting phase-adjusted data strobe signal;

a flip-flop that latches the data signal in synchronization with a rising or falling edge of the resulting phase-adjusted data strobe signal output from the DQS phase adjustment unit for a memory rank selected by the rank enable signal; and a DQS phase decision unit configured to decide on the phase adjustment value in the DQS phase adjustment unit for the selected memory rank based on an output signal of the flip-flop, wherein a DQS phase adjustment unit for the selected memory rank adjusts the phase of the data strobe signal depending on the adjustment value decided on by the DQS phase decision unit.

7. The control device according to claim 6, wherein the plurality of memory ranks are distinguished from one another by a chip select signal.

8. The control device according to claim 7, wherein the data input unit holds values, indicating a delay value of a data strobe signal for each of the memory ranks, as the data strobe delay values.

9. The control device according to claim 7, wherein the control unit is configured to supply the rank enable signal, as a chip select signal, to a memory device belonging to the selected memory rank.

10. The control device according to claim 6, wherein the DQS phase adjustment unit comprises:

a counter that counts in response to a clock signal;

a first register that holds a count value of the counter when a signal output from the flip-flop shifts from a first level to a second level;

a second register that holds a count value of the counter when a signal output from the flip-flop shifts from the second level to the first level; and an arithmetic logic circuit that calculates an average value between the count value held by the first register and the count value held by the second register, wherein the adjustment value is decided on based on the average value.

11. The control device according to claim 6, wherein each of the DQS phase adjustment units comprises a plurality of delay lines that delay the data strobe signal by a predetermined delay time value to output the resulting delayed signal, and the signal output from one of the delay lines is output to the flip-flop.

12. The control device according to claim 11, wherein each of the DQS phase adjustment units comprises a shift register that receives the rank enable signal to hold the signal received as the shift register shifts the signal in response to a clock signal, and each of the DQS phase adjustment units selects one of the delay lines in response to a signal held at each stage of the shift register to output a signal output from the selected delay line to the flip-flop.

13. The control device according to claim 9, wherein the data input unit comprises:

a plurality of DQS phase adjustment units provided in association with each of the memory ranks; the DQS phase adjustment units receiving the data strobe signal and adjusting a phase thereof to output the resulting phase-adjusted data strobe signal;

a plurality of flip-flops that latch a plurality of the data signals in synchronization with a rising or falling edge of the phase-adjusted data strobe signal output from the DQS phase adjustment unit for a memory rank selected by the rank enable signal; and a DQS phase decision unit that decides on a phase adjustment value in the DQS phase adjustment unit for the selected memory rank based on output signals of the flip-flops, wherein the DQS phase adjustment unit for the selected memory rank adjusts the phase of the data strobe signal depending on the adjustment value decided on by the DQS phase decision unit.

14. The control device according to claim 13, wherein the DQS phase decision unit comprises:

a counter that counts in response to a clock signal;

a first register that holds a count value of the counter when a signal output from a selected one of the flip-flops shifts from the first level to the second level;

a second register that holds a count value of the counter when a signal output from the selected flip-flop shifts from the second level to the first level; and an arithmetic logic circuit that calculates an average value between the count value held by the first register and the count value held by the second register, wherein the adjustment value is decided on based on a mean value obtained on averaging a plurality of the average values for the flip-flops.

* * * * *